US011747255B2

(12) United States Patent
Chen et al.

(10) Patent No.: US 11,747,255 B2
(45) Date of Patent: Sep. 5, 2023

(54) METHOD FOR DESIGNING FORMULA OF WATER-BASED PRINTING INK BASED ON LOW-FIELD NUCLEAR MAGNETIC RESONANCE

(71) Applicants: NANTONG TEXTILE & SILK INDUSTRIAL TECHNOLOGY RESEARCH INSTITUTE, Nantong (CN); SOOCHOW UNIVERSITY, Jiangsu (CN)

(72) Inventors: Guoqiang Chen, Jiangsu (CN); Chengyong Gao, Jiangsu (CN); Tieling Xing, Jiangsu (CN)

(73) Assignees: NANTONG TEXTILE & SILK INDUSTRIAL TECHNOLOGY RESEARCH INSTITUTE, Nantong (CN); SOOCHOW UNIVERSITY, Jiangsu (CN)

( * ) Notice: Subject to any disclaimer, the term of this patent is extended or adjusted under 35 U.S.C. 154(b) by 520 days.

(21) Appl. No.: 16/947,207

(22) Filed: Jul. 23, 2020

(65) Prior Publication Data
US 2021/0072133 A1 Mar. 11, 2021

(30) Foreign Application Priority Data
Sep. 6, 2019 (CN) .......................... 201910844088.8

(51) Int. Cl.
| | |
|---|---|
| G01V 3/00 | (2006.01) |
| G01N 13/00 | (2006.01) |
| C09D 11/38 | (2014.01) |
| G01N 24/08 | (2006.01) |
| G01R 33/44 | (2006.01) |

(52) U.S. Cl.
CPC ............. *G01N 13/00* (2013.01); *C09D 11/38* (2013.01); *G01N 24/08* (2013.01); *G01R 33/448* (2013.01)

(58) Field of Classification Search
CPC ...... G01N 13/00; G01N 24/08; G01N 24/085; G01N 11/00; C09D 11/38; G01R 33/448; G01R 33/445; D06P 1/0032; D06P 5/30
USPC ....................................................... 324/309
See application file for complete search history.

(56) References Cited

U.S. PATENT DOCUMENTS

| | | | |
|---|---|---|---|
| 2015/0268574 A1* | 9/2015 | Miyaake ................ | C08G 81/00 399/111 |
| 2016/0091812 A1* | 3/2016 | Makabe ............. | G03G 9/08793 430/105 |
| 2016/0223926 A1* | 8/2016 | Miyaake .............. | G03G 9/0821 |

* cited by examiner

*Primary Examiner* — Walter L Lindsay, Jr.
*Assistant Examiner* — Frederick Wenderoth
(74) *Attorney, Agent, or Firm* — Tutunjian & Bitetto, P.C.

(57) ABSTRACT

The low-field nuclear magnetic resonance (LF-NMR) is used in the design of a formula of a water-based printing ink and selection of the water-based printing ink or a wetting agent. The water-based printing ink or the wetting agent is quickly selected through the inversion data of an LF-NMR transverse relaxation time ($T_2$). By using LF-NMR to detect the distribution of water in the water-based printing ink or wetting agent, the water-based printing ink is quickly detected in real-time and a high-quality water-based printing ink is selected, which contributes to the design and development of water-based printing inks. The state of water in the ink also is adjusted based on the relationship between the distribution state of water in the printing ink and the definition of the printed pattern, thereby ensuring the definition of the printed pattern.

8 Claims, 12 Drawing Sheets

METHOD FOR DESIGNING FORMULA OF WATER-BASED PRINTING INK BASED ON LOW-FIELD NUCLEAR MAGNETIC RESONANCE

TECHNICAL FIELD

The present invention relates to the field of printing inks, in particular to a method for designing a formula of a water-based printing ink based on low-field nuclear magnetic resonance (LF-NMR).

TECHNICAL BACKGROUND

Inkjet printing has many advantages, such as less equipment investment, simple process, less floor space, easy operation, no need to wash after printing, no sewage discharge, environmental friendliness, fine patterns and high yield, which satisfies commercial needs. Inkjet printing is a process in which the designed pattern is accurately printed on the fiber fabric by an inkjet printer, and then the ink is adsorbed to the fiber fabric through high-temperature fixation. It has two key technical points: the preparation of color paste and the preparation of printing ink. The printing ink must have proper viscosity, pH, conductivity, surface tension and other physical properties and stability to ensure good printing. At present, the formulas of water-based printing inks on the market are mainly adjusted through a large number of orthogonal experiments, which has a series of problems such as low efficiency, high labor force, complicated experiments and consumption of large amounts of chemical reagents.

SUMMARY

In order to solve the above-mentioned technical problems, an objective of the present invention is to provide a method for designing a formula of a water-based printing ink based on low-field nuclear magnetic resonance (LF-NMR). The present invention realizes the rapid selection of a water-based printing ink or a wetting agent, including the detection of water content and distribution, and predicts the definition of the contour of the printed pattern.

A first objective of the present invention is to disclose use of LF-NMR in the design of a formula of a water-based printing ink and selection of a water-based printing ink or a wetting agent.

A second objective of the present invention is to provide a method for designing a formula of a water-based printing ink based on LF-NMR, including the following steps:

(1) acquiring NMR echo signals of the water-based printing ink by using a Carr-Purcell-Meiboom-Gill (CPMG) pulse sequence to obtain an echo attenuation curve, where the CPMG pulse sequence has the following parameters: 90° pulse width P1: 8.0 μs, 180° pulse width P2: 15 μs, waiting time TW: 12,000.00 ms, analog gain RG1: 20.0, digital gain DGR1: 3, preamp gain PGR: 1, number of scans NS: 4, number of echoes NECH: 12,000, receiver bandwidth: SW 100 KHz, and radio frequency delay RFD: 0.150 ms;

(2) deriving a spectral curve of a transverse relaxation time $T_2$ by using an inversion algorithm thereof based on the echo attenuation curve;

(3) determining the moisture retention and/or fluidity of the water-based printing ink according to a peak area and a displacement of immobile water and free water in the spectral curve of the transverse relaxation time $T_2$; stopping adjusting the formula of the water-based printing ink if the moisture retention and/or fluidity meets a target value; proceeding to step (4) if the moisture retention and/or fluidity does not meet the target value; and (4) adjusting the formula of the water-based printing ink, and returning to step (1).

Further, step (1) further includes drying the water-based printing ink at 55-65° C. for different times before acquiring the NMR echo signals.

Further, in step (4), the adjusting the formula of the water-based printing ink includes changing the type and/or the amount of a wetting agent.

In step (3), a smaller transverse relaxation time $T_2$ indicates lower fluidity of water in the water-based printing ink, which leads to better moisture retention.

Generally, water in the water-based printing ink exists in the state of free water, associated water and bound water, and the increase in the content of the associated water and bound water helps to improve the moisture retention of the printing ink. The definition of the contour of the printed pattern is directly related to the infiltration of the water-based printing ink on the fabric, and the infiltration of the water-based printing ink on the fabric is related to the fluidity. Therefore, the definition of the contour of the printed pattern can be controlled by adjusting the water content and distribution in the water-based printing ink.

A third objective of the present invention is to provide a method for selecting a water-based printing ink based on LF-NMR, including the following steps:

(1) acquiring NMR echo signals of one or more water-based printing inks by using a CPMG pulse sequence to obtain an echo attenuation curve, where the CPMG pulse sequence has the following parameters: 90° pulse width P1: 8.0 μs, 180° pulse width P2: 15 μs, waiting time TW: 12,000.00 ms, analog gain RG1: 20.0, digital gain DGR1: 3, preamp gain PGR: 1, number of scans NS: 4, number of echoes NECH: 12,000, receiver bandwidth: SW 100 KHz, and radio frequency delay RFD: 0.150 ms;

(2) deriving a spectral curve of a transverse relaxation time $T_2$ by using an inversion algorithm thereof based on the echo attenuation curve;

(3) determining the moisture retention and/or fluidity of the water-based printing inks according to a peak area and a displacement of immobile water and free water in the spectral curve of the transverse relaxation time $T_2$, and selecting a water-based printing ink with moisture retention and/or fluidity meeting a target value.

Further, step (1) further includes drying the water-based printing ink at 55-65° C. for different times before acquiring the NMR echo signals.

In step (3), a smaller transverse relaxation time $T_2$ indicates lower fluidity of water in the water-based printing ink, which leads to better moisture retention.

A fourth objective of the present invention is to provide a method for selecting a wetting agent based on LF-NMR, including the following steps:

(1) acquiring NMR echo signals of an aqueous solution of one or more wetting agents by using a CPMG pulse sequence to obtain an echo attenuation curve, where the CPMG pulse sequence has the following parameters: 90° pulse width P1: 8.0 μs, 180° pulse width P2: 15 μs, waiting time TW: 12,000.00 ms, analog gain RG1: 20.0, digital gain DGR1: 3, preamp gain PGR: 1, number of scans NS: 4, number of echoes NECH: 12,000, receiver bandwidth: SW 100 KHz, and radio frequency delay RFD: 0.150 ms;

(2) deriving a spectral curve of a transverse relaxation time $T_2$ by using an inversion algorithm thereof based on the echo attenuation curve;

(3) determining the moisture retention and/or fluidity of the wetting agent according to a peak area and a displacement of immobile water and free water in the spectral curve of the transverse relaxation time $T_2$, and selecting a wetting agent with moisture retention and/or fluidity meeting a target value.

Further, step (1) further includes drying the wetting agent at 55-65° C. for different times before acquiring the NMR echo signals.

Further, in step (1), the aqueous solution of the wetting agent has a concentration of 5-30 wt %.

In step (3), a smaller transverse relaxation time $T_2$ indicates lower fluidity of water in the aqueous solution of the wetting agent, and better effects of the wetting agent and water lead to better moisture retention.

In the present invention, unless otherwise specified, the water-based printing ink is preferably an aqueous direct-jet disperse printing ink.

By adopting the above solutions, the present invention at least has the following advantages.

1. The present invention discloses a new use of the LF-NMR technique, which is simple and convenient to operate, and can quickly and accurately select a wetting agent or a water-based printing ink with excellent moisture retention, accelerating the research and development of formulating water-based printing inks.

2. The present invention provides a method for evaluating the water content and distribution in the water-based printing ink or the wetting agent and the moisture retention of the water-based printing ink or the wetting agent. The present invention takes the LF-NMR relaxation inversion data of the test sample as the research object and the proton intensity and distribution of water in the test sample and the changes of water in different environments as indicators. The present invention analyzes the LF-NMR parameters and physiochemical indicators of the direct-jet disperse printing inks, and selects a water-based printing ink or a wetting agent with the best water retention. According to the selection results, the present invention regulates the infiltration of the water-based printing ink on the fabric by regulating the content and distribution of water in the water-based printing ink, providing guidance for the design and development of high-quality aqueous direct-jet disperse printing inks.

The above described are merely an overview of the technical solutions of the present invention. To make the technical means of the present invention more comprehensible and implemented in accordance with the content of the specification, the present invention is described in detail below with reference to the preferred examples of the present invention and accompanying drawings.

DETAILED DESCRIPTION

The specific implementations of the present invention are described in further detail below with reference to the examples. The following examples are intended to illustrate the present invention, rather than to limit the scope of the present invention.

Example 1

This example provides a method for selecting a wetting agent of a direct-jet disperse printing ink based on low-field nuclear magnetic resonance (LF-NMR), specifically including:

(1) Aqueous solutions of wetting agents (isopropanol, ethylene glycol, diethylene glycol, glycerol and propylene glycol) with different mass fractions were prepared, which had the concentration of 5 wt %, 10 wt %, 15 wt %, 20 wt %, 25 wt % and 30 wt % respectively. 1.5 g of the aqueous solutions of wetting agents were accurately weighed and placed in a constant-temperature (60° C.) drying oven for 210 min.

(2) A PQ001 LF-NMR analyzer was used to perform LF-NMR analysis on the different aqueous solutions of wetting agents in step (1). NMR echo signals were acquired by using a Carr-Purcell-Meiboom-Gill (CPMG) pulse sequence, and transverse relaxation times $T_2$ of the aqueous solutions of wetting agents were measured. The acquisition parameters included: 90° pulse width P1: 8.0 µs, 180° pulse width P2: 15 µs, waiting time TW: 12,000.00 ms, analog gain RG1: 20.0, digital gain DGR1: 3, preamp gain PGR: 1, number of scans NS: 4, number of echoes NECH: 12,000, receiver bandwidth: SW 100 KHz, and radio frequency delay RFD: 0.150 ms. Thus, echo attenuation curves were obtained.

(3) The echo attenuation curve data of the LF-NMR samples in step (2) were processed by an inversion algorithm of the transverse relaxation times $T_2$ to obtain LF-NM transverse relaxation spectra, including crest times and areas of various peaks.

(4) FIGS. 1 to 5 show transverse relaxation spectra of the aqueous solutions of isopropanol, ethylene glycol, diethylene glycol, glycerol and propylene glycol with different concentrations after being dried at 60° C. for 210 min. The results showed that the aqueous solution samples of wetting agents contained water in two states, immobile water ($T_{21}$) (FIGS. 1a, 2a, 3a, 4a and 5a) and free water ($T_{22}$) (FIGS. 1b, 2b, 3b, 4b and 5b). The transverse relaxation times of the aqueous solutions of wetting agents shifted to the left with the increase of the mass fraction, indicating that the fluidity (volatility) of water decreased with the increase of the alcohol content. By comparing the aqueous solutions of the wetting agents with different concentrations, a greater mass fraction of the wetting agents in the aqueous solutions indicates a greater amplitude of the LF-NMR spectra.

Figure 6:
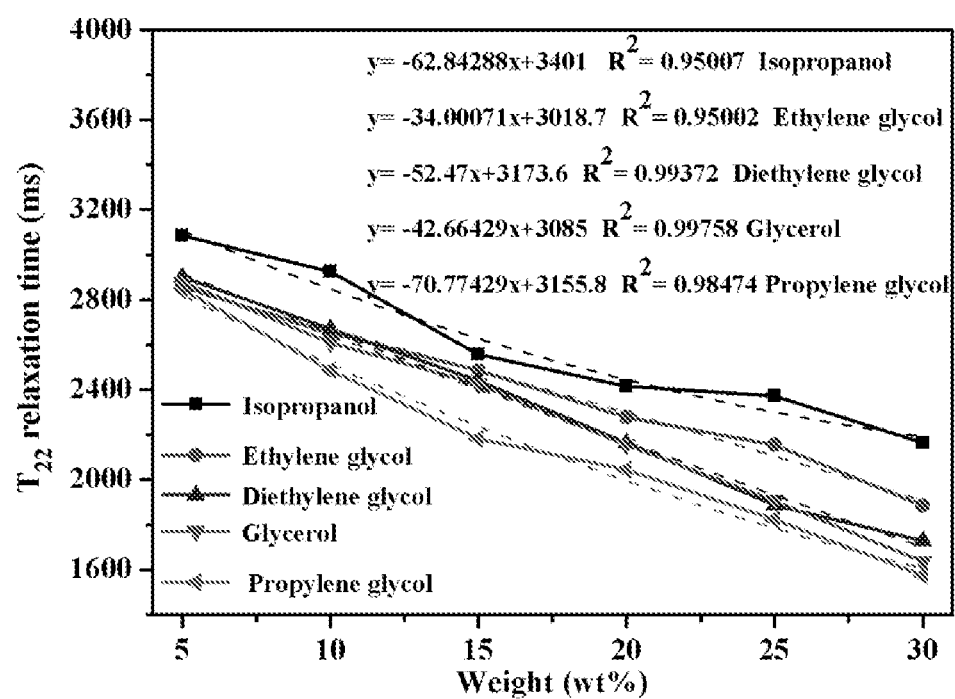
FIG. 6 shows a relationship between the inversion data ($T_{22}$) of aqueous solutions of different wetting agents and concentrations of wetting agents.
Figure 7:
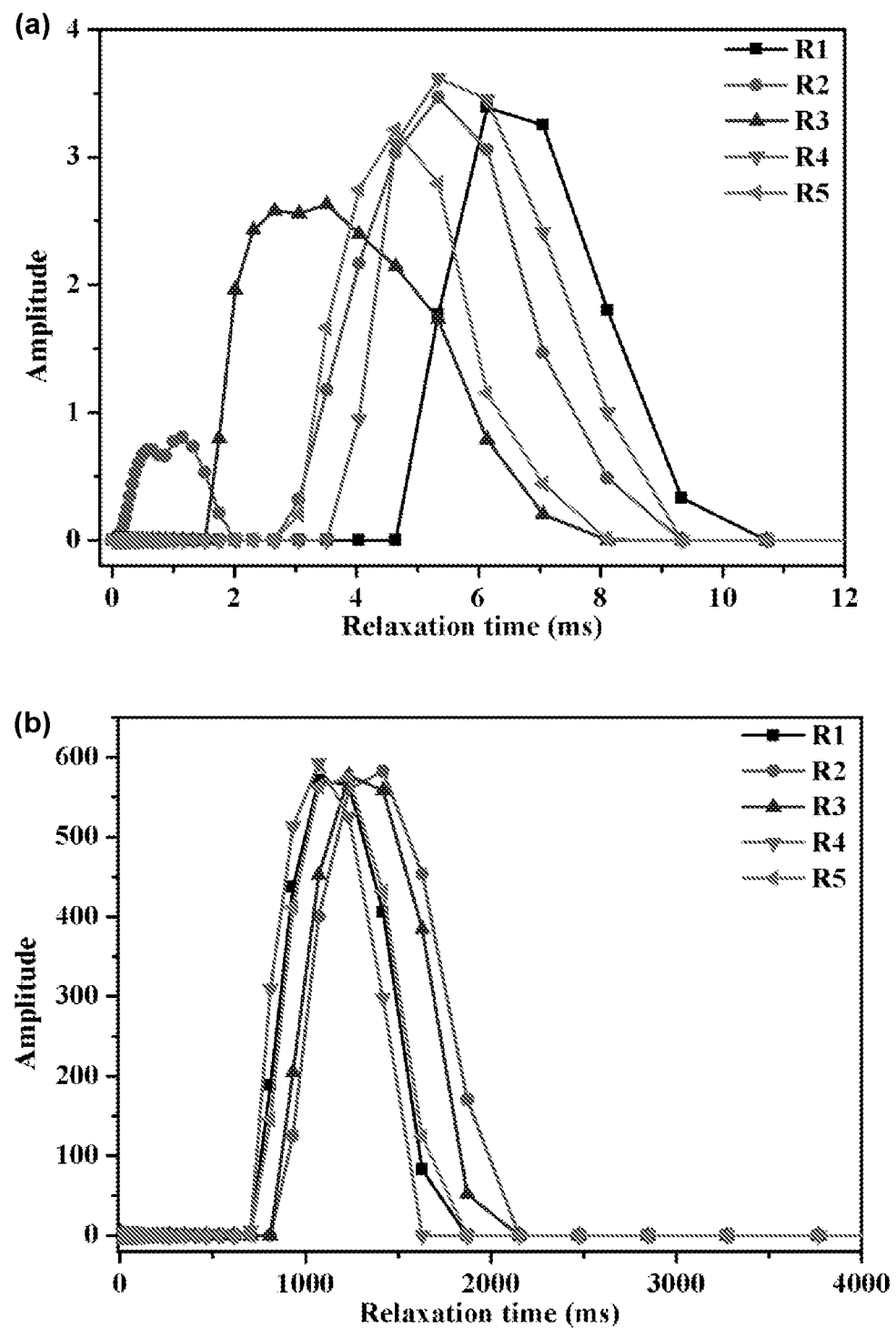
FIG. 7 shows transverse relaxation spectra of $T_{21}$ and $T_{22}$ of different formulas of direct-jet disperse printing inks after being dried at 60° C. for 0 min.
Figure 8:
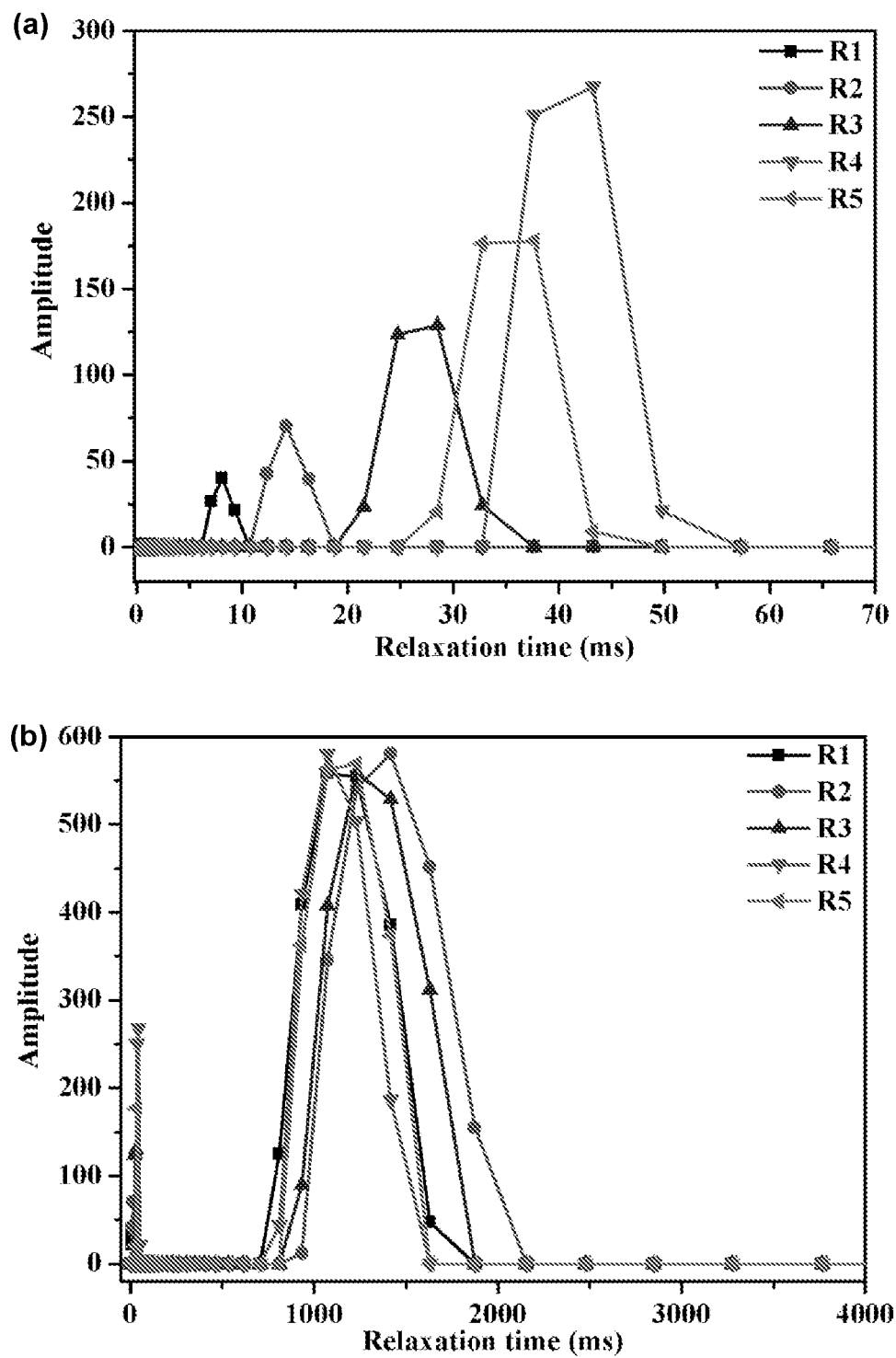
FIG. 8 shows transverse relaxation spectra of $T_{21}$ and $T_{22}$ of different formulas of direct-jet disperse printing inks after being dried at 60° C. for 70 min.
Figure 9:
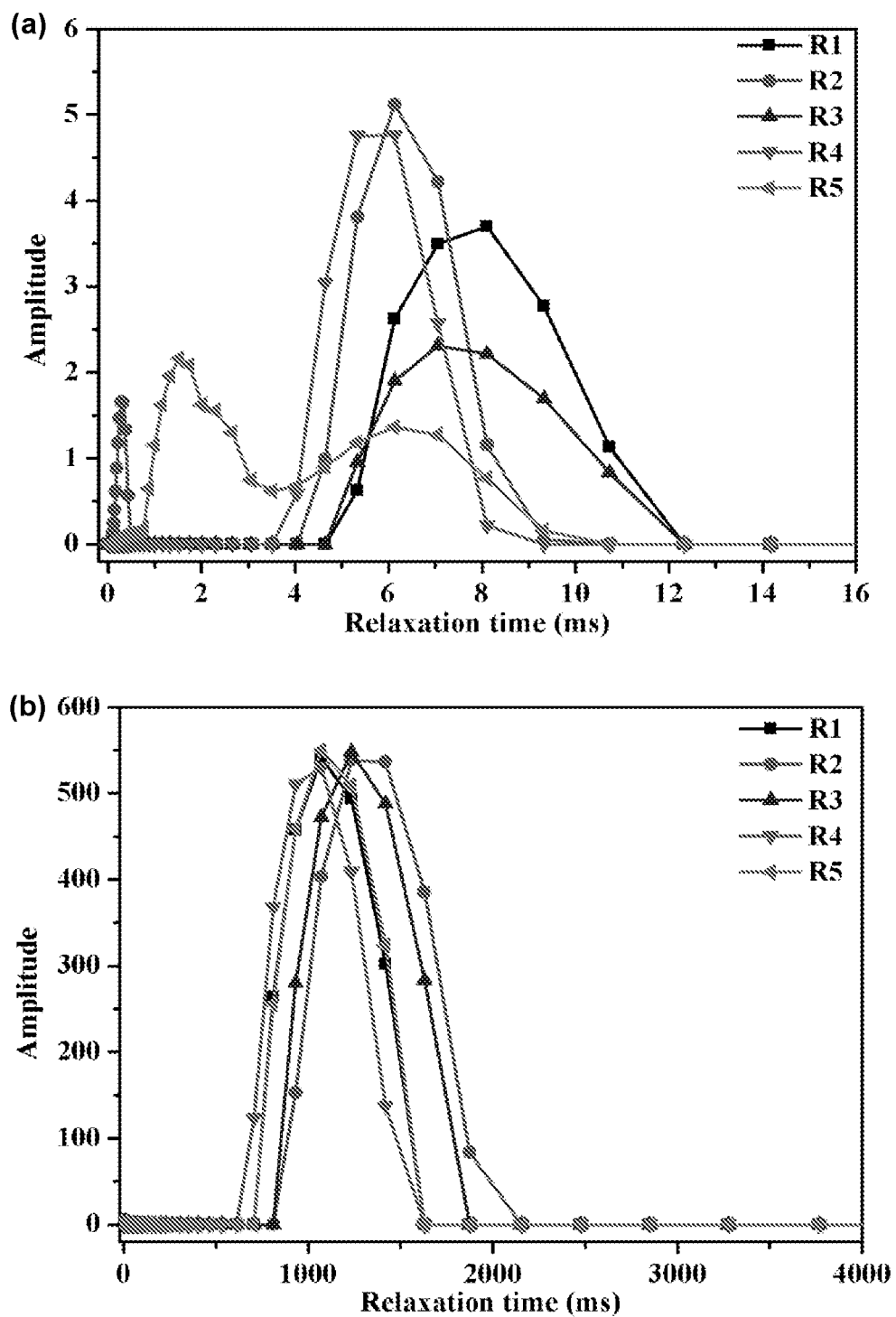
FIG. 9 shows transverse relaxation spectra of $T_{21}$ and $T_{22}$ of different formulas of direct-jet disperse printing inks after being dried at 60° C. for 140 min.
Figure 10:
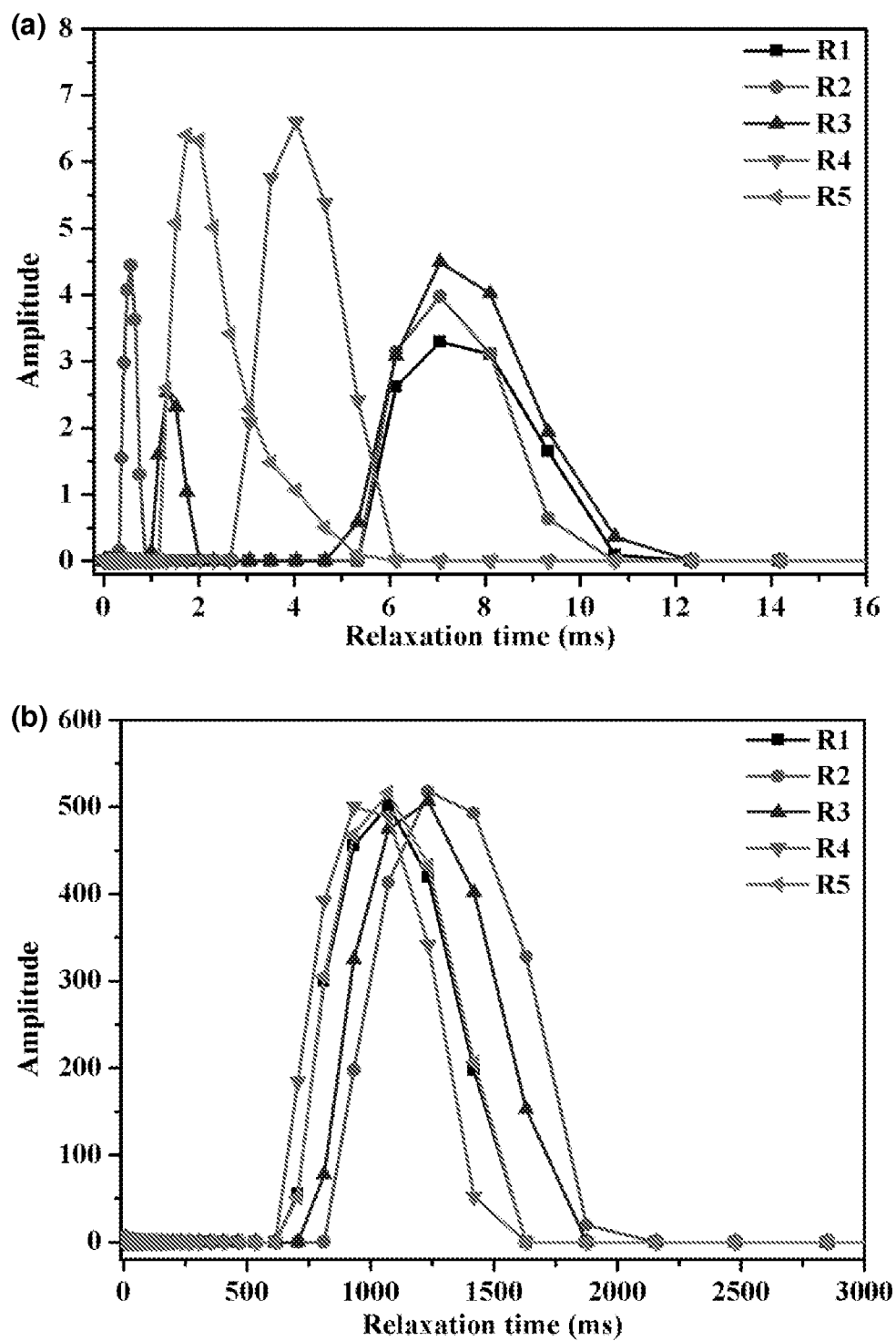
FIG. 10 shows transverse relaxation spectra of $T_{21}$ and $T_{22}$ of different formulas of direct-jet disperse printing inks after being dried at 60° C. for 210 min.

FIG. 6 shows a relationship between the inversion data ($T_{22}$) of aqueous solutions of different wetting agents and concentrations of wetting agents. As shown in FIG. 6, $T_{22}$ shifts to the left with the increase of the mass fractions of the wetting agents in the aqueous solutions, indicating a decrease in the fluidity of water in the aqueous solutions of the wetting agents. The data were fit to obtain the fitting curves of the wetting agents as follows: y=−62.84288x+3401, R2=0.95007 (isopropanol), y=−34.00071x+3018.7, R2=0.95002 (ethylene glycol), y=−52.47x+3173.6, R2=0.99372 (diethylene glycol), y=−42.66429x+3085, R2=0.99758 (glycerol) and y=−70.77429x+3155.8, R2=0.98474 (propylene glycol). It can be seen from the figure that the slope of the wetting agents varies, and the slope of propylene glycol is the smallest, indicating that with the increase of the mass fraction, propylene glycol can quickly reduce the fluidity of water and weaken its volatilization. It can be concluded that among the above wetting agents, propylene glycol has the best moisture retention.

Example 2

This example provides a method for selecting a direct-jet disperse printing ink based on LF-NMR. This example selects a direct-jet disperse printing ink with the best moisture retention by dynamically monitoring water distribution and moisture retention of the direct-jet disperse printing ink. Specifically:

(1) Five direct-jet disperse printing inks with different formulas were prepared, which were named R1, R2, R3, R4 and R5. 1.5 of the prepared direct-jet disperse printing ink samples were accurately weighed, 4 parts for each sample. The 4 parts of each of the samples were placed in a constant-temperature (60° C.) drying oven for 0.70, 140 and 210 min, respectively.

(2) A PQ001 LF-NMR analyzer was used to perform LF-NMR analysis on the direct-jet disperse printing inks of different formulas in step (1). NMR echo signals were acquired by using a CPMG pulse sequence, and transverse relaxation times $T_2$ of the direct-jet disperse printing inks were measured. The acquisition parameters included: 90° pulse width P1: 8.0 µs, 180° pulse width P2: 15 µs, waiting time TW: 12,000.00 ms, analog gain RG1: 20.0, digital gain DGR1: 3, preamp gain PGR: 1, number of scans NS: 4, number of echoes NECH: 12,000, receiver bandwidth: SW 100 KHz, and radio frequency delay RFD: 0.150 ms. Thus, echo attenuation curves were obtained.

(3) The echo attenuation curve data of the LF-NMR samples in step (2) were processed by an inversion algorithm of the transverse relaxation times $T_2$ to obtain LF-NM transverse relaxation spectra.

(4) FIGS. 7 to 10 show transverse relaxation spectra of $T_{21}$ (FIGS. 7a to 10a) and $T_{22}$ (FIGS. 7b to 10b) of different formulas of direct-jet disperse printing inks after being dried at 60° C. for 0, 70, 140 and 210 min. The results showed that the samples of the direct-jet disperse printing inks with different formulas contained water in two states, immobile water ($T_{21}$) and free water ($T_{22}$). The moisture retention of the inks was determined according to the peak areas and displacements of $T_{21}$ and $T_{22}$. An ink with $T_{21}$ occupying the largest ratio or $T_{21}$ and $T_{22}$ shifting to the left had the best moisture retention. The results show that formula R4 has the best moisture retention.

Example 3

This example provides a method for selecting a direct-jet disperse printing ink based on LF-NMR. This example predicts a relationship between the water content and distribution in the ink and the definition of the contour of the printed pattern, and further selects an ink with a high-definition printed pattern, specifically:

(1) Direct-jet disperse printing inks with different formulas were prepared, which were named R-1, R-2, R-3, R-4, R-5, Y-1, Y-2, Y-3, Y-4. Y-5, B-1, B-2, B-3, B-4, B-5, K-1, K-2, K-3, K-4 and K-5, respectively. 1.5 g of the prepared direct-jet disperse printing inks with different formulas were accurately weighed.

(2) A PQ001 LF-NMR analyzer was used to perform LF-NMR analysis on the direct-jet disperse printing inks of different formulas in step (1). NMR echo signals were acquired by using a CPMG pulse sequence, and transverse relaxation times $T_2$ of the aqueous solutions of alcohols were measured. The acquisition parameters included: 90° pulse width P1: 8.0 µs, 180° pulse width P2: 15 µs, waiting time TW: 12,000.00 ms, analog gain RG1: 20.0, digital gain DGR1: 3, preamp gain PGR: 1, number of scans NS: 4, number of echoes NECH: 12,000, receiver bandwidth: SW 100 KHz, and radio frequency delay RFD: 0.150 ms. Thus, echo attenuation curves were obtained.

(3) The echo attenuation curve data of the LF-NMR samples in step (2) were processed by an inversion algorithm of the transverse relaxation times $T_2$ to obtain LF-NMR transverse relaxation spectra of the direct-jet disperse printing inks.

Figure 11:
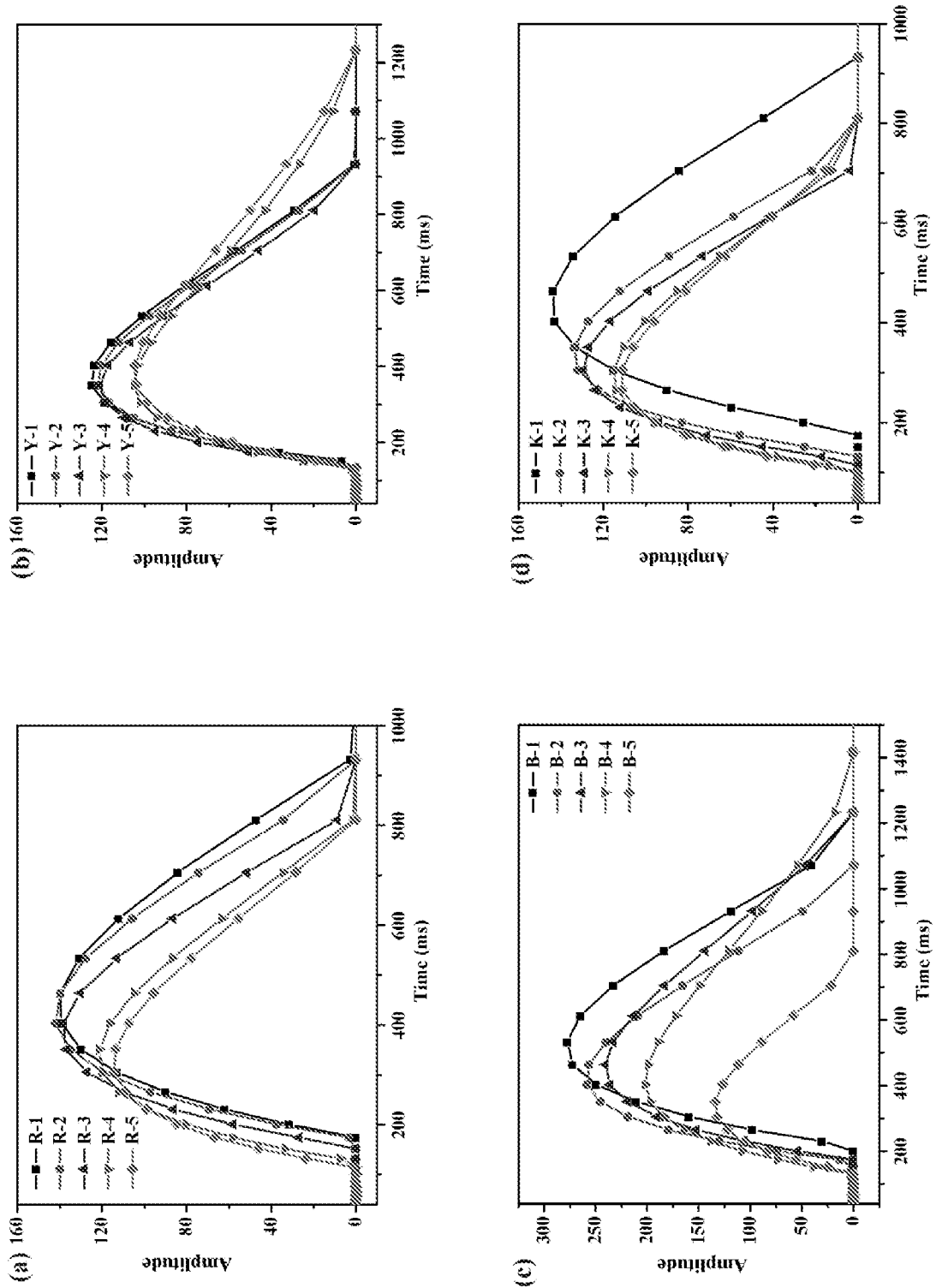
FIG. 11 shows transverse relaxation spectra of different formulas of direct-jet disperse printing inks.

FIG. 11 shows transverse relaxation spectra of different formulas of direct-jet disperse printing inks. As shown in FIG. 11, the transverse relaxation times $T_2$ of the direct-jet disperse printing inks with different formulas vary. The left shift of $T_2$ means low fluidity of water in the inks. Overall, the direct-jet disperse printing inks R-4, Y-4, B-4 and K-4 have the smallest transverse relaxation time and the lowest fluidity.

Figure 1:
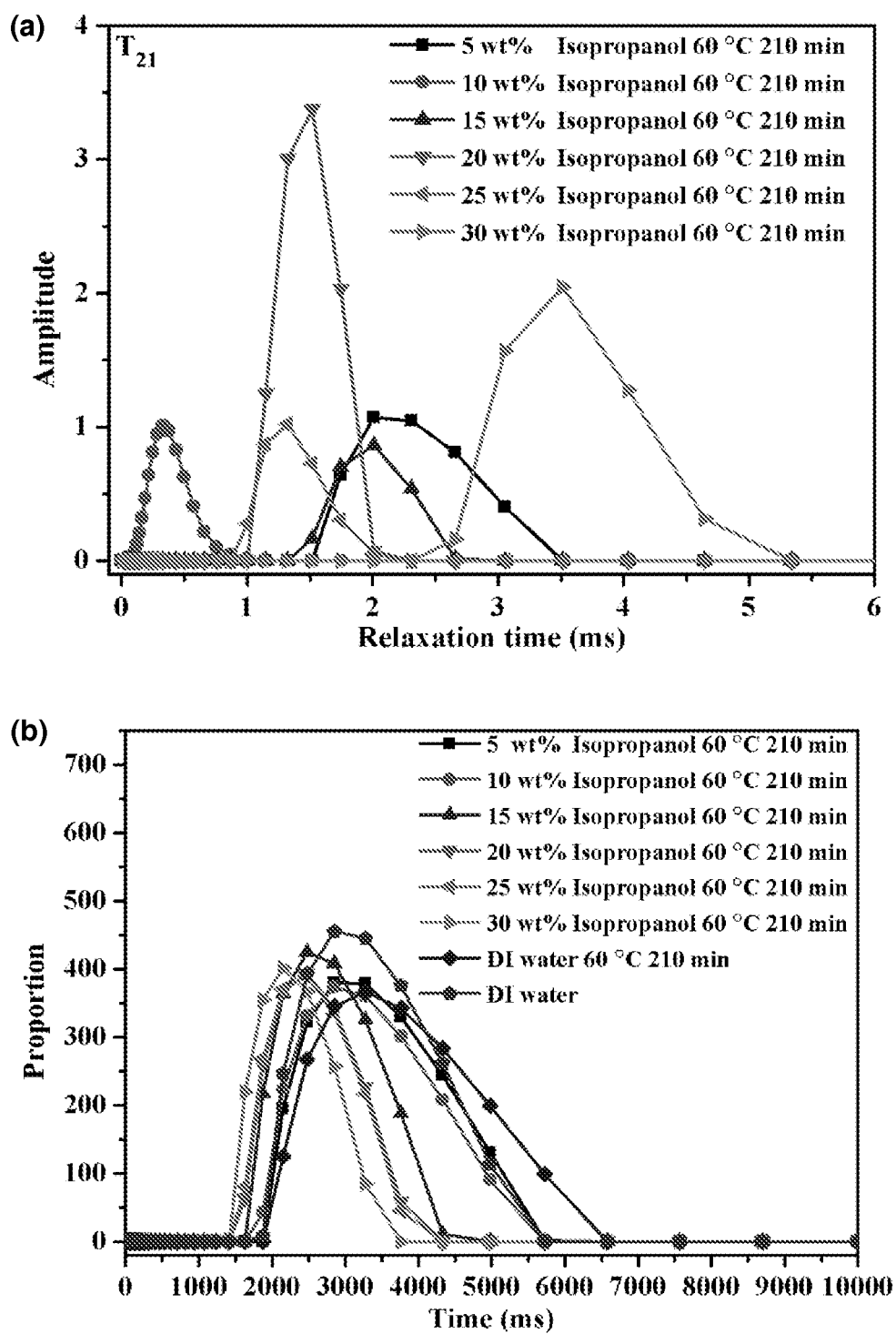
FIG. 1 shows transverse relaxation spectra of aqueous solutions of isopropanol with different concentrations after being dried at 60° C. for 210 min.
Figure 2:
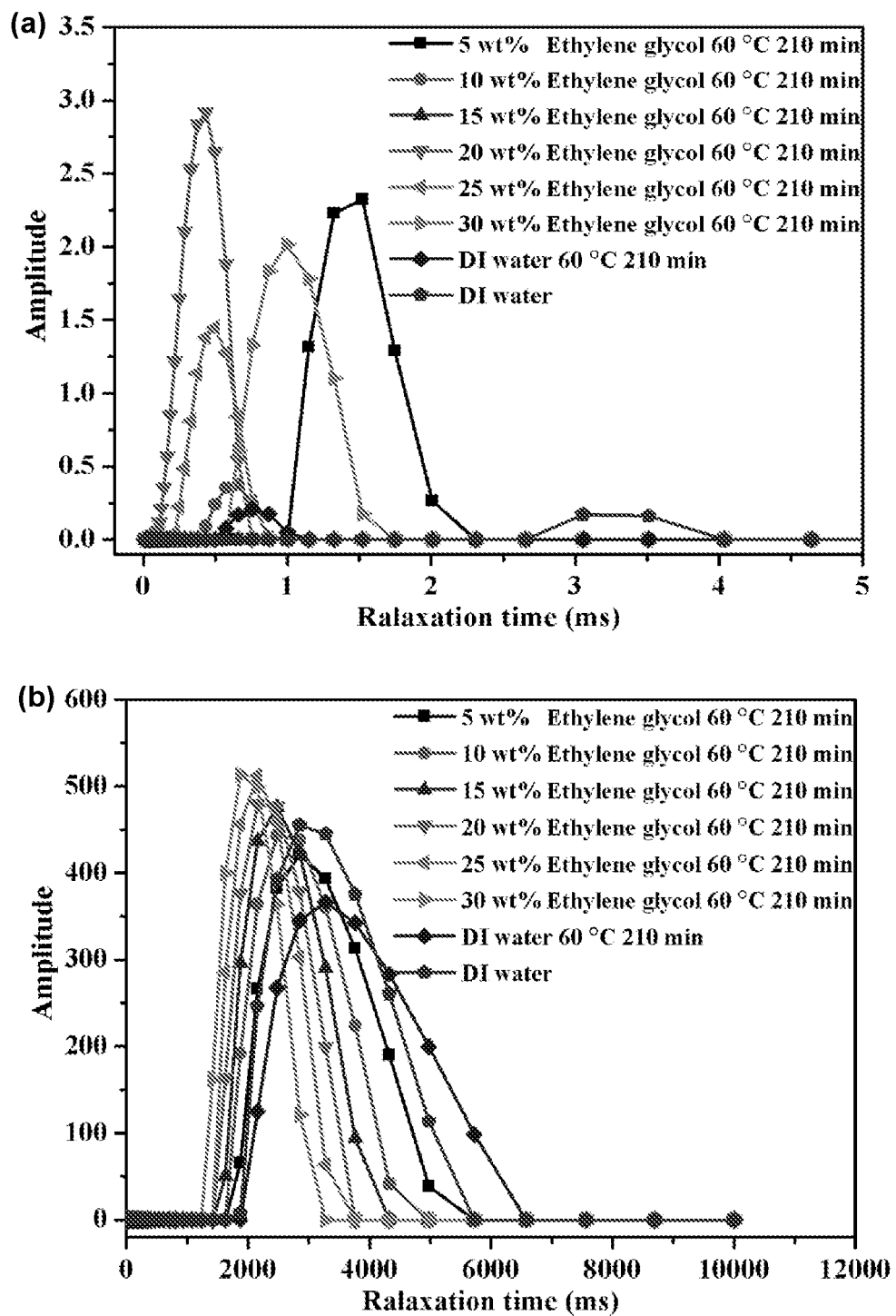
FIG. 2 shows transverse relaxation spectra of aqueous solutions of ethylene glycol with different concentrations after being dried at 60° C. for 210 min.
Figure 3:
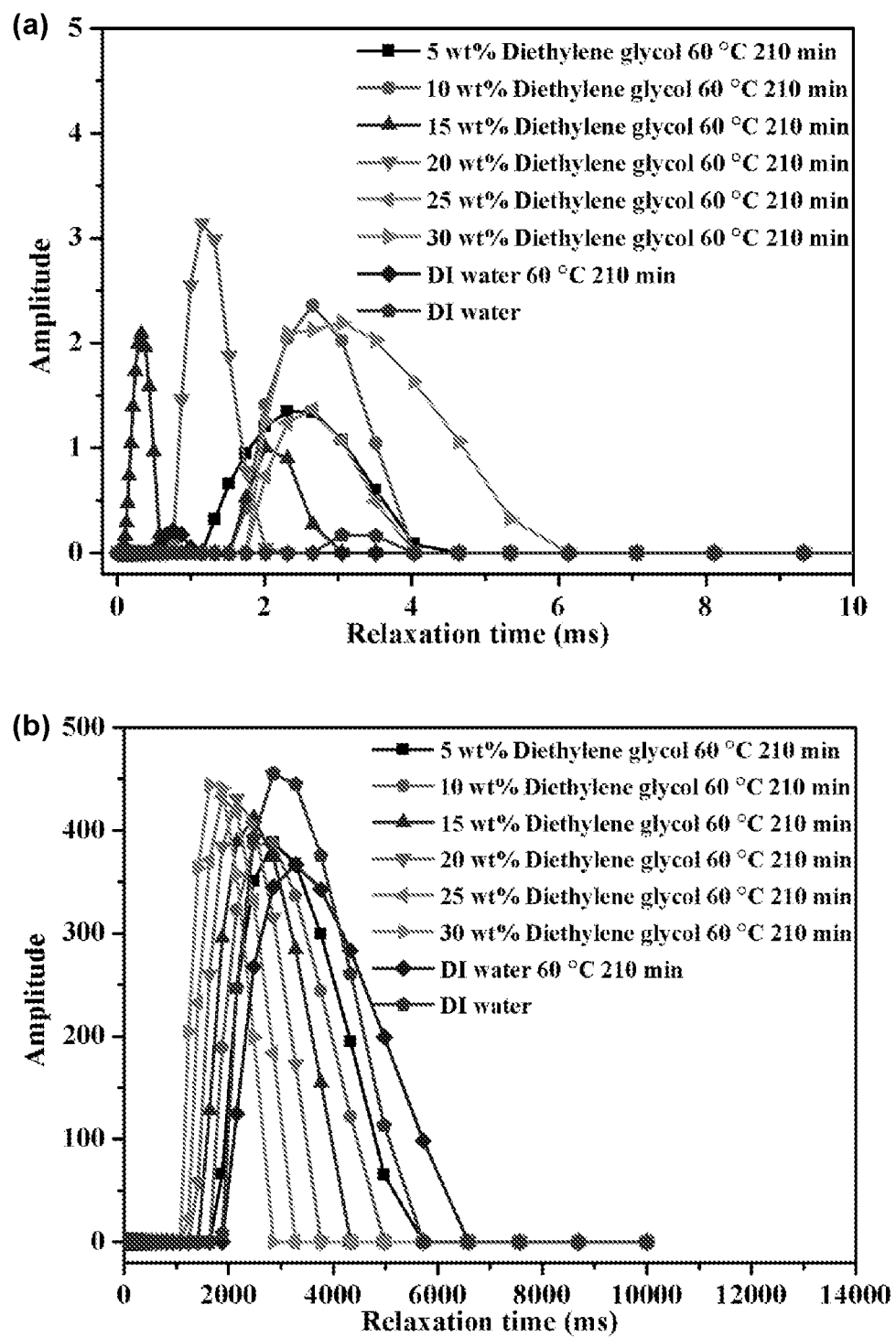
FIG. 3 shows transverse relaxation spectra of aqueous solutions of diethylene glycol with different concentrations after being dried at 60° C. for 210 min.
Figure 4:
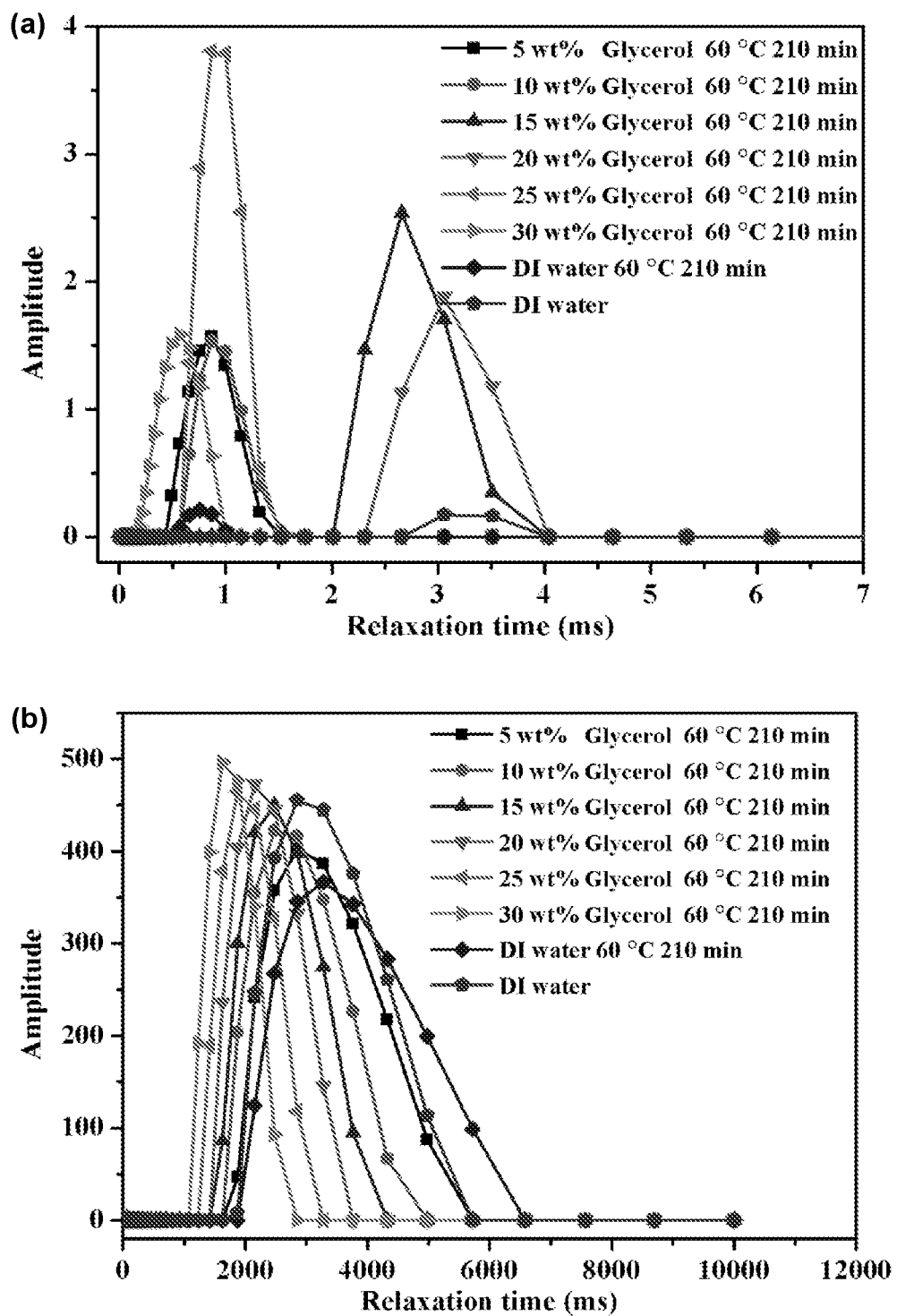
FIG. 4 shows transverse relaxation spectra of aqueous solutions of glycerol with different concentrations after being dried at 60° C. for 210 min.
Figure 5:
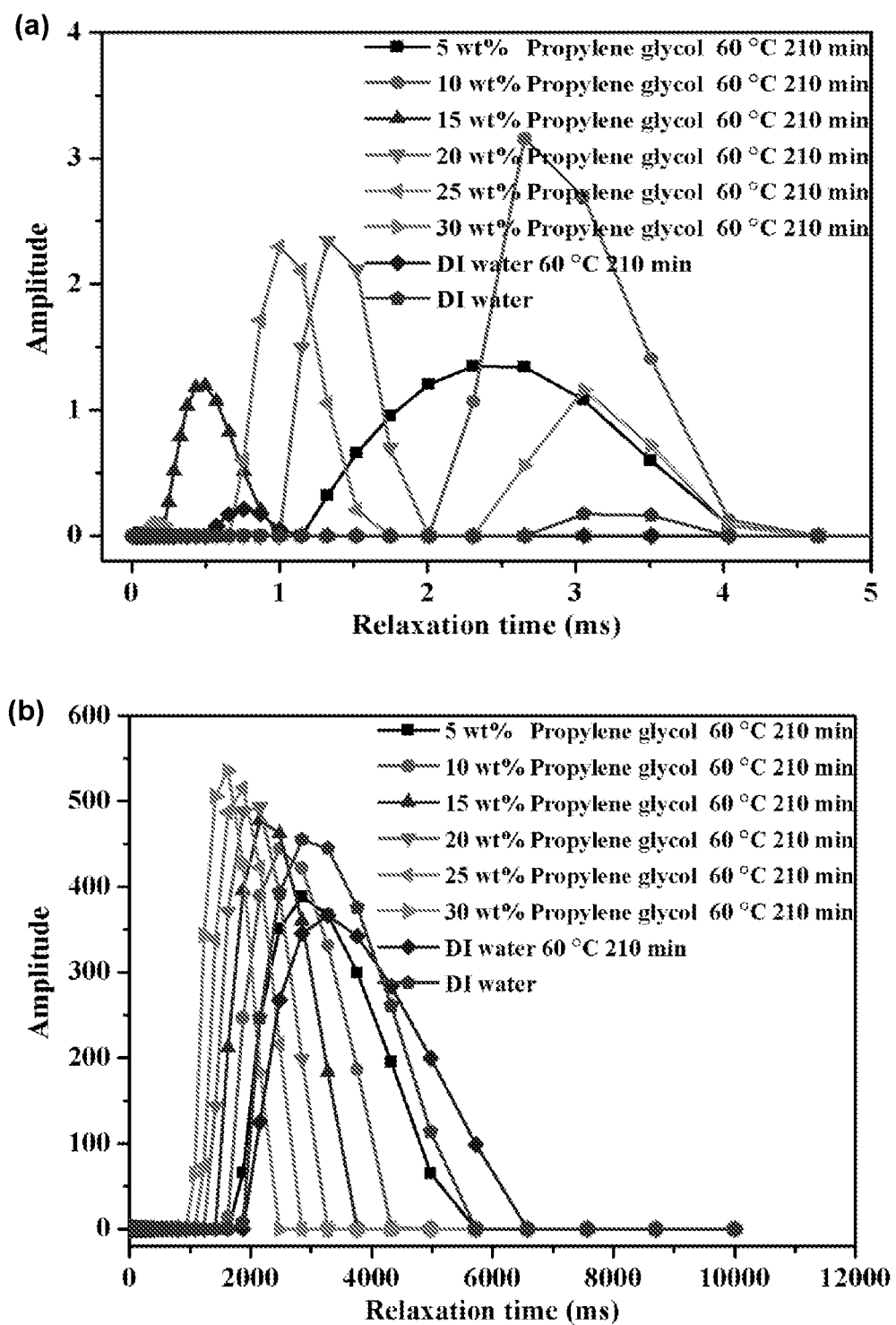
FIG. 5 shows transverse relaxation spectra of aqueous solutions of propylene glycol with different concentrations after being dried at 60° C. for 210 min.
Figure 12:
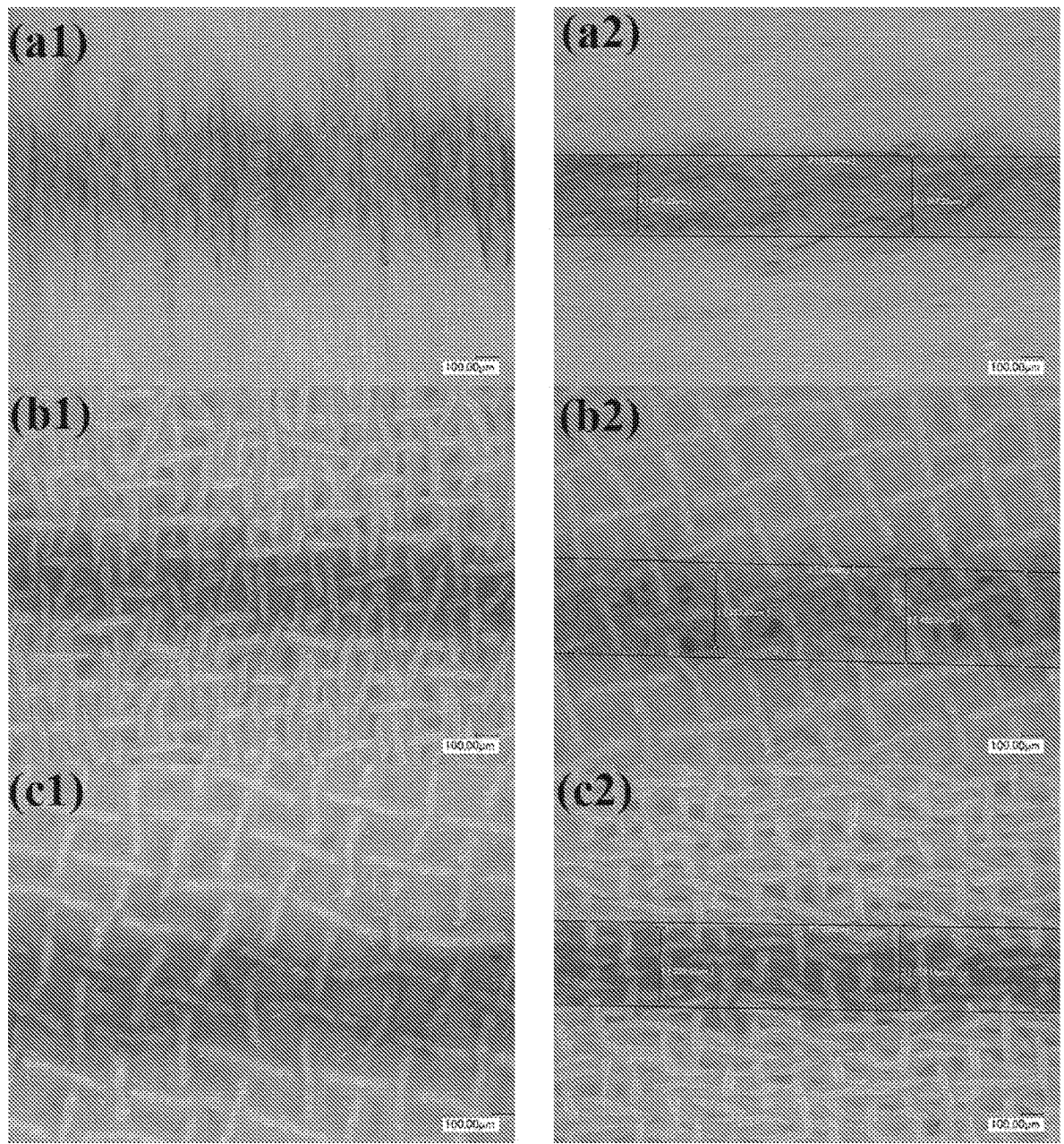
FIG. 12 shows printed patterns of a direct-jet disperse printing ink on different fabrics.

R-1, R-2, R-3, R-4 and R-5 inks were selected for inkjet printing on the surface of different fabrics. The results showed that R-4 had the best definition of printed contour. This is because the R-4 direct-jet disperse printing ink had the smallest $T_2$ and the lowest fluidity. As the ink was not easy to infiltrate on the fabric, the definition of the printed pattern was ensured. FIG. 12 shows printed patterns of R-4 on different fabrics. FIGS. 12a1, 12b1 and 12c1 show a radial printing direction and FIGS. 12a2, 12b2 and 12c2 show a weft printing direction. FIGS. 12a1 and 12a2 correspond to No. 1 fabric, FIGS. 12b1 and 12b2 correspond to No. 2 fabric, and FIGS. 12c1 and 12c2 correspond to No. 3 fabric. The results showed that the contour definition of the printed patterns in the weft direction is higher than that of the printed patterns in the radial direction.

In summary, the present invention provides a promising new process. The rapid determination of the fluidity of aqueous inks by LF-NMR provides guidance for the design and development of aqueous direct-jet disperse printing inks.

The above described are only preferred implementations of the present invention. It should be noted that for a person of ordinary skill in the art, several improvements and modifications may further be made without departing from the technical principle of the present invention. These improvements and modifications should also be deemed as falling within the protection scope of the present invention.

What is claimed is:

1. A method for designing a formula of a water-based printing ink based on low-field nuclear magnetic resonance (LF-NMR), comprising the following steps:
    (1) acquiring LF-NMR echo signals of the water-based printing ink by using a Carr-Purcell-Meiboom-Gill (CPMG) pulse sequence to obtain an echo attenuation curve, wherein the CPMG pulse sequence has the following parameters: 90° pulse width P1: 8.0 μs, 180° pulse width P2: 15 μs, waiting time: 12,000.00 ms, analog gain 20.0, digital gain: 3, preamp gain: 1, number of scans: 4, number of echoes: 12,000, receiver bandwidth: 100 KHz, and radio frequency delay: 0.150 ms;
    (2) deriving a spectral curve of a transverse relaxation time $T_2$ by using an inversion algorithm thereof based on the echo attenuation curve;
    (3) determining moisture retention and/or fluidity of the water-based printing ink according to a peak area and a displacement of immobile water and free water in the spectral curve of the transverse relaxation time $T_2$; stopping adjusting the formula of the water-based printing ink if the moisture retention and/or fluidity meets a target value; proceeding to step (4) if the moisture retention and/or fluidity does not meet the target value; and
    (4) adjusting the formula of the water-based printing ink, and returning to step (1).

2. A method for selecting a water-based printing ink based on low-field nuclear magnetic resonance (LF-NMR), comprising the following steps:
    (1) acquiring LF-NMR echo signals of one or more water-based printing inks by using a Carr-Purcell-Meiboom-Gill (CPMG) pulse sequence to obtain an echo attenuation curve, wherein the CPMG pulse sequence has the following parameters: 90° pulse width P1: 8.0 μs, 180° pulse width P2: 15 μs, waiting time: 12,000.00 ms, analog gain: 20.0, digital gain: 3, preamp gain: 1, number of scans: 4, number of echoes: 12,000, receiver bandwidth: 100 KHz, and radio frequency delay: 0.150 ms;
    (2) deriving a spectral curve of a transverse relaxation time $T_2$ by using an inversion algorithm thereof based on the echo attenuation curve; and
    (3) determining moisture retention and/or fluidity of the water-based printing inks according to a peak area and a displacement of immobile water and free water in the spectral curve of the transverse relaxation time $T_2$, and selecting a water-based printing ink with moisture retention and/or fluidity meeting a target value.

3. A method for selecting a wetting agent based on low-field nuclear magnetic resonance (LF-NMR), comprising the following steps:
    (1) acquiring LF-NMR echo signals of an aqueous solution of one or more wetting agents by using a Carr-Purcell-Meiboom-Gill (CPMG) pulse sequence to obtain an echo attenuation curve, wherein the CPMG pulse sequence has the following parameters: 90° pulse width P1: 8.0 μs, 180° pulse width P2: 15 μs, waiting time: 12,000.00 ms, analog gain: 20.0, digital gain: 3, preamp gain: 1, number of scans: 4, number of echoes: 12,000, receiver bandwidth: 100 KHz, and radio frequency delay: 0.150 ms;
    (2) deriving a spectral curve of a transverse relaxation time $T_2$ by using an inversion algorithm thereof based on the echo attenuation curve; and
    (3) determining moisture retention and/or fluidity of the wetting agent according to a peak area and a displacement of immobile water and free water in the spectral curve of the transverse relaxation time $T_2$, and selecting a wetting agent with moisture retention and/or fluidity meeting a target value.

4. The method according to claim 1, wherein step (1) further comprises drying the water-based printing ink at 55-65° C. before acquiring the LF-NMR echo signals.

5. The method according to claim 1, wherein in step (4), the adjusting the formula of the water-based printing ink comprises changing a type and/or amount of a wetting agent.

6. The method according to claim 2, wherein step (1) further comprises drying the water-based printing ink at 55-65° C. before acquiring the LF-NMR echo signals.

7. The method according to claim 3, wherein step (1) further comprises drying the wetting agent at 55-65° C. before acquiring the LF-NMR echo signals.

8. The method according to claim 3, wherein in step (1), the aqueous solution of the wetting agent has a concentration of 5-30 wt %.

* * * * *